(12) United States Patent
Brask et al.

(10) Patent No.: US 6,939,815 B2
(45) Date of Patent: Sep. 6, 2005

(54) METHOD FOR MAKING A SEMICONDUCTOR DEVICE HAVING A HIGH-K GATE DIELECTRIC

(75) Inventors: Justin K. Brask, Portland, OR (US);
Mark L. Doczy, Beaverton, OR (US);
Scott A. Hareland, Tigard, OR (US);
John P. Barnak, Portland, OR (US);
Matthew V. Metz, Hillsboro, OR (US);
Jack Kavalieros, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/652,796

(22) Filed: Aug. 28, 2003

(65) Prior Publication Data

US 2005/0048794 A1 Mar. 3, 2005

(51) Int. Cl.⁷ .............................. H01L 21/31
(52) U.S. Cl. .................................... 438/785
(58) Field of Search .................. 438/4, 216, 240, 438/257, 287, 475, 774, 778, 785

(56) References Cited

U.S. PATENT DOCUMENTS

| | | | |
|---|---|---|---|
| 5,625,217 A | 4/1997 | Chau et al. ............... 257/412 |
| 5,753,560 A | 5/1998 | Hong et al. ............... 438/402 |
| 5,783,478 A | 7/1998 | Chau et al. ............... 438/592 |
| 5,891,798 A | 4/1999 | Doyle et al. ............... 438/624 |
| 6,063,698 A | 5/2000 | Tseng et al. ............... 438/585 |
| 6,087,261 A | 7/2000 | Nishikawa et al. ......... 438/685 |
| 6,121,094 A | 9/2000 | Gardner et al. ............ 438/287 |
| 6,140,198 A * | 10/2000 | Liou ....................... 438/382 |
| 6,165,802 A * | 12/2000 | Cuchiaro et al. ............. 438/3 |
| 6,184,072 B1 | 2/2001 | Kaushik et al. ............ 438/197 |
| 6,306,742 B1 | 10/2001 | Doyle et al. ............... 438/591 |
| 6,391,802 B1 | 5/2002 | Delpech et al. ............ 438/785 |
| 6,420,279 B1 | 7/2002 | Ono et al. .................. 48/785 |
| 6,436,777 B1 | 8/2002 | Ota ........................ 438/305 |
| 6,475,874 B2 | 11/2002 | Xiang et al. .............. 438/396 |
| 6,514,828 B2 | 2/2003 | Ahn et al. ................ 438/297 |
| 6,544,906 B2 | 4/2003 | Rotondaro et al. ........ 438/785 |
| 6,617,209 B1 | 9/2003 | Chau et al. ............... 438/240 |
| 6,617,210 B1 | 9/2003 | Chau et al. ............... 438/240 |
| 6,737,341 B1 * | 5/2004 | Yamamoto et al. ........ 438/585 |
| 6,743,643 B2 * | 6/2004 | Joshi et al. ................... 438/3 |
| 2002/0175358 A1 * | 11/2002 | Yamamichi ................ 257/296 |
| 2002/0197790 A1 | 12/2002 | Kizilyalli et al. ........... 438/240 |
| 2003/0032303 A1 | 2/2003 | Yu et al. .................... 438/770 |
| 2003/0045080 A1 | 3/2003 | Visokay et al. ............ 438/591 |
| 2003/0113972 A1 * | 6/2003 | Hayashi et al. ............ 438/287 |
| 2004/0033661 A1 * | 2/2004 | Yeo et al. .................. 438/253 |
| 2004/0092073 A1 * | 5/2004 | Cabral et al. .............. 438/287 |

OTHER PUBLICATIONS

Doug Barlage et al., "High–Frequency Response of 100nm Integrated CMOS Transistors with High–K Gate Dielectrics", 2001 IEEE, 4 pages.

(Continued)

Primary Examiner—Craig A. Thompson
Assistant Examiner—Jennifer M Dolan
(74) Attorney, Agent, or Firm—Blakely, Sokoloff, Taylor and Zafman

(57) ABSTRACT

A method for making a semiconductor device is described. That method comprises forming a metal oxide layer on a substrate, converting at least part of the metal oxide layer to a metal layer; and oxidizing the metal layer to generate a metal oxide high-k gate dielectric layer.

14 Claims, 1 Drawing Sheet

OTHER PUBLICATIONS

Robert Chau et al., A 50nm Depleted–Substrate CMOS Transistor (DST), 2001 IEEE, 4 pages.

Lu et al., "Dual–Metal Gate Technology for Deep–Submicron CMOS Devices", dated Apr. 29, 2003, 1 page.

Schwantes et al., "Performance Improvement of Metal Gate CMOS Technologies with Gigabit Feature Sizes", Technical University of Hanburg–Harburg, 5 pages.

Chau et al., "A Method of Making Semiconductor Device Having a High–K Gate Dielectric", U.S. Appl. No. 10/082,530, filed Feb. 22, 2002.

Parker et al., "A Method of Making Semiconductor Device Having a High–K Gate Dielectric", U.S. Appl. No. 10/285,915, filed Oct. 31, 2002.

Chau et al., "A Method of Making Semiconductor Device Having a High–K Gate Dielectric", U.S. Appl. No. 10/288,043, filed Nov. 5, 2002.

Parker et al., "A Method of Making Semiconductor Device Having a High–K Gate Dielectric", U.S. Appl. No. 10/315,268, filed Dec. 10, 2002.

Doczy et al., "A Method of Making Semiconductor Device Having a High–K Gate Dielectric", U.S. Appl. No. 10/338,174, filed Jan. 7, 2003.

Brask et al., "A Method of Making Semiconductor Device Having a High–K Gate Dielectric", U.S. Appl. No. 10/387,303, filed Mar. 11, 2003.

Brask et al., "A Method of Making Semiconductor Device Having a High–K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask, et al, "A Method for Making a Semiconductor Device Having a High–K Gate Dielectric", U.S. Appl. No. 10/441,616, filed May 20, 2003.

Polishchuk et al., "Dual Workfunction CMOS Gate Technology Based on Metal Interdiffusion," www.eesc.berkeley.edu, 1 page.

* cited by examiner

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

When high-k films comprise an oxide formed using a metal halide precurser (e.g., a metal chloride), they may contain significant amounts of impurities (e.g., residual chlorine), which may adversely affect the electrical properties of a device that includes that film. In addition, an oxide based high-k film may manifest oxygen vacancies at random surface sites. When the device's gate electrode comprises polysilicon, a silicide may form where such vacancies occur. The silicide's presence may alter the electrode's workfunction or cause the device to short through the dielectric.

Accordingly, there is a need for an improved process for making a semiconductor device that includes a high-k gate dielectric. There is a need for such a process that forms a purified high-k film prior to forming a polysilicon gate electrode on that film. There is also a need for such a process that generates a high-k film with a nearly idealized metal:oxygen stoichiometry. The method of the present invention provides such a process.

DETAILED DESCRIPTION OF THE PRESENT INVENTION

A method for making a semiconductor device is described. That method comprises forming a metal oxide layer on a substrate, converting at least part of the metal oxide layer to a metal layer; and oxidizing the metal layer to generate a metal oxide high-k gate dielectric layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In the method of the present invention, a metal oxide layer is formed on a substrate. The substrate may comprise a bulk silicon or silicon-on-insulator substructure. Alternatively, the substrate may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation upon which a semiconductor device may be built falls within the spirit and scope of the present invention.

When the substrate comprises a silicon wafer, the wafer may be cleaned before forming the metal oxide layer on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

Figure 1A:
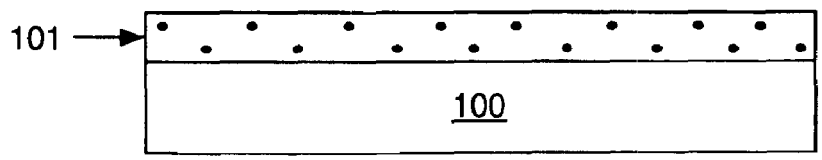
FIGS. 1a–1e represent cross-sections of structures that may be formed when carrying out an embodiment of the method of the present invention. Features shown in these figures are not intended to be drawn to scale.

After that cleaning treatment, metal oxide layer 101 is formed on substrate 100, generating the structure illustrated by FIG. 1a. Materials for making the metal oxide layer include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide. Particularly preferred are hafnium oxide, zirconium oxide, titanium oxide, and aluminum oxide. Although a few examples of materials that may be used to form metal oxide layer 101 are described here, that layer may be made from other materials, as will be apparent to those skilled in the art.

Metal oxide layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and metal oxide layer 101. The CVD reactor should be operated long enough to form a layer with the desired thickness. In most applications, metal oxide layer 101 should be less than about 40 angstroms thick, and more preferably between about 5 angstroms and about 20 angstroms thick—i.e., less than or equal to about 5 monolayers thick.

As deposited, metal oxide layer 101 may include undesirable impurities, e.g., residual chlorine (represented by dots in FIG. 1a), which render that layer incompatible with polysilicon. The method of the present invention transforms metal oxide layer 101 into a metal oxide high-k gate dielectric layer that includes less impurities and that is compatible with polysilicon. A two step process induces that transformation. First, at least part of metal oxide layer 101 is converted into a metal layer. Second, that metal layer is oxidized to generate the metal oxide high-k gate dielectric layer.

Figure 1B:
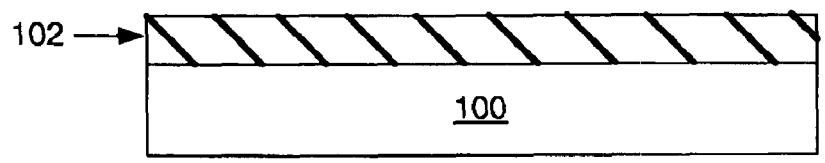

Part or all of metal oxide layer 101 may be converted into metal layer 102, as FIG. 1b illustrates, via a chemical reduction process that uses conventional equipment, materials, and operating conditions. In such a chemical reduction process, metal oxide layer 101 may be converted to metal layer 102 by exposing metal oxide layer 101 to hydrogen, which may be contained in a hydrogen containing gas or a hydrogen based plasma.

When a hydrogen containing gas is used, it may consist essentially of hydrogen, or, alternatively, include hydrogen and an inert gas, e.g., helium or argon. When including an inert gas, the hydrogen containing gas should comprise about 5% hydrogen. Prior to exposing metal oxide layer 101 to such a hydrogen containing gas, the reaction chamber should be purged to prevent undesirable reaction between layer 101 and oxygen or nitrogen. The reduction process may take place under ambient conditions.

When metal oxide layer 101 is less than or equal to about 20 angstroms thick, substantially all of that layer may be reduced to metal layer 102 by feeding enough hydrogen into the reaction chamber to remove substantially all of the oxygen included in metal oxide layer 101. To remove the oxygen and a significant amount of impurities, the ratio of hydrogen atoms (fed into the reaction chamber) to the number of oxygen atoms (contained in the metal oxide layer) must exceed 2:1. By permitting the reaction to proceed until substantially all of layer 101 is reduced to metal layer 102, such a reduction process may remove more than 80% of the impurities that had been contained in layer 101.

When metal oxide layer 101 is reduced to metal layer 102 by exposing it to a hydrogen based plasma, a direct plasma enhanced chemical vapor deposition ("PECVD") process or a remote plasma enhanced chemical vapor deposition ("RPECVD") process may be used. In such a PECVD or RPECVD process, metal oxide layer 101 may be reduced to metal layer 102 by exposing it to hydrogen and to certain ionized species generated by a plasma source. When a PECVD process is used, such ionized species may be generated by feeding hydrogen and an inert gas into the reactor, then striking a plasma within the reactor. When a RPECVD process is used, the plasma may be stricken remotely, followed by feeding the resulting ionized species and hydrogen (or a mixture of hydrogen and an inert gas) into the reactor—downstream from the plasma source.

When metal oxide layer 101 is less than about 20 angstroms thick, the reactor should be operated under the appropriate conditions (e.g., temperature, pressure, radio frequency, and power) for a sufficient time to reduce all (or substantially all) of metal oxide layer 101 to metal layer 102. When layer 101 is significantly greater than 20 angstroms thick, the reactor should be operated long enough to reduce the upper portion of that layer. It is believed that this reduction operation removes undesirable impurities (e.g., residual chlorine) from metal oxide layer 101 by causing hydrogen ions to react with those impurities (e.g., hydrogen ions reacting with chlorine ions to form hydrogen chloride). It is further believed that this reduction step may remove impurities from metal oxide layer 101 without damaging the resulting metal layer.

Although the reduction operation will remove a significant amount of undesirable impurities (e.g., residual chlorine or another halogen—represented by dots in FIG. 1a) as part or all of metal oxide layer 101 is reduced to metal layer 102, FIG. 1b is not meant to suggest that this reduction step will remove all undesirable impurities, which were initially present in metal oxide layer 101. That process step may, however, remove a sufficient number of those impurities to ensure that a subsequently formed metal oxide high-k gate dielectric layer will be compatible with a gate electrode to be formed on it. Thus, a method that removes a significant number of the undesirable impurities initially present in metal oxide layer 101, but which does not remove all—or even substantially all—of those impurities, still falls within the spirit and scope of the present invention.

Although a few examples of processes that may be used to reduce at least part of metal oxide layer 101 to metal layer 102 are described here, other reducing operations may be used, as will be apparent to those skilled in the art. Examples include other types of wet or dry chemical reducing processes, e.g., those that use aqueous solutions or plasmas with different reducing agents. Various combinations of these processes may also be employed.

As an alternative to such chemical reduction processes, an electrochemical reduction operation may be used. In such a process, metal oxide layer 101 is placed into a chemical bath. By passing an electric current through the bath, part or all of metal oxide layer 101 may be reduced to metal layer 102. Processes that may be used to reduce metal oxide layer 101 to metal layer 102 are not limited to those described above. The method of the present invention contemplates using any suitable reduction operation that removes oxygen from at least part of metal oxide layer 101 and that removes a substantial number of impurities from that layer.

Figure 1C:
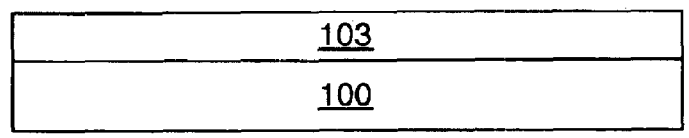

After metal oxide layer 101 has been reduced to metal layer 102, metal layer 102 is oxidized, e.g., by using an oxidizing agent. That oxidizing agent may comprise a solution that contains a mild oxidant, such as a peroxide (e.g., hydrogen peroxide or an organic peroxide) or ozone. Alternatively, the oxidizing agent may comprise an oxidizing gas, e.g., one that contains oxygen. Such an oxidation step may convert metal layer 102 into metal oxide high-k gate dielectric layer 103, as shown in FIG. 1c.

The resulting metal oxide high-k gate dielectric layer 103 will comprise a material with a dielectric constant that is greater than the dielectric constant of silicon dioxide, and that preferably is at least about twice that of silicon dioxide, i.e., a dielectric constant that is greater than about 8. A mild oxidation process (i.e., a more controllable and less aggressive procedure) should be used to prevent oxidation of substrate 100, or to at least minimize the amount of substrate oxidation. Preferably, no oxidation occurs on the substrate, when the metal layer is oxidized to generate the metal oxide high-k gate dielectric layer. In some cases, however, an insignificant amount of oxidation, e.g., less than about 10 angstroms (equal to 1 or 2 monolayers), may grow on substrate 100 without adversely affecting the overall process.

When the oxidizing agent comprises a peroxide containing aqueous solution, metal layer 102 preferably is oxidized by exposing it to a solution that comprises hydrogen peroxide. Such an aqueous solution may contain between about 2% and about 30% hydrogen peroxide by volume. The exposure step should take place at between about 15° C. and about 70° C. for at least about one minute. In a particularly preferred embodiment, metal layer 102 is exposed to an aqueous solution that contains about 6.7% $H_2O_2$ by volume for about 10 minutes at a temperature of about 25° C.

When metal layer 102 is oxidized by exposing it to a solution that comprises hydrogen peroxide, it may be desirable to simultaneously apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$. Conventional equipment, materials, and operating conditions may be used, when oxidizing metal layer 102 with a hydrogen peroxide containing solution.

If metal layer 102 is oxidized by exposing it to a gas stream that includes oxygen, care must be taken to ensure that an undesirable oxide does not form on substrate 100. To prevent unacceptable oxide growth, such an oxidation step should take place under ambient conditions for less than about one minute and preferably for less than about 30 seconds—when oxidizing a 20 angstrom thick film with a gas that consists essentially of oxygen. A significantly longer reaction time may be used if the film is much more than 20 angstroms thick, and/or if the oxygen containing gas includes a substantial amount of an inert gas.

Although a few examples of processes for oxidizing metal layer 102 are described here, other oxidizing treatments may be used, as will be apparent to those skilled in the art. Examples include other types of chemical oxidation processes, e.g., those using aqueous solutions with different oxidizing agents. A plasma assisted oxidation process may be used, as may various combinations of these processes. The process used to oxidize metal layer 101 is thus not limited to those described above. The method of the present invention contemplates using any suitable oxidizing step that takes place in any suitable oxidizing ambient, or any acceptable chemical treatment that serves to replace the oxygen that was removed by the preceding reduction step. In a preferred embodiment, the amount of oxygen included in metal oxide high-k gate dielectric layer 103 significantly exceeds the amount of oxygen included in metal oxide layer 101.

Figure 1D:
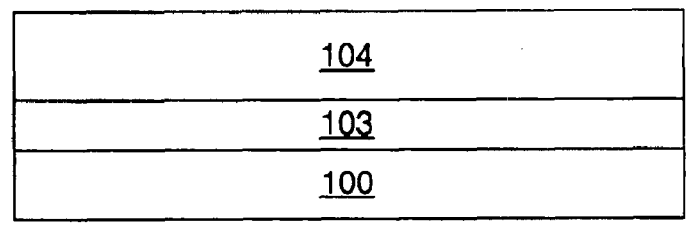
Figure 1E:
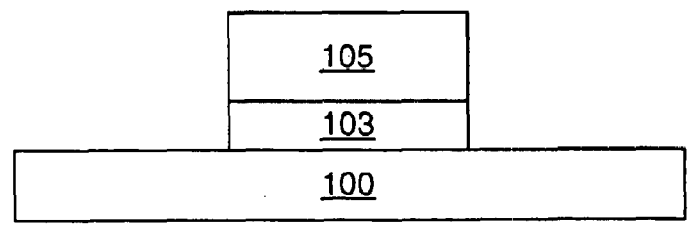

Following the oxidation of metal layer 102 to form metal oxide high-k gate dielectric layer 103, a gate electrode may be formed directly on dielectric layer 103. In a preferred embodiment, the gate electrode may be formed by initially depositing polysilicon layer 104 on dielectric layer 103—generating the FIG. 1d structure. Polysilicon layer 104 may be deposited using conventional methods and preferably is between about 500 angstroms and about 4,000 angstroms thick. After etching both layers 104 and 103 to form the FIG. 1e structure, additional steps that are generally used to complete the gate electrode (e.g., forming a silicide (not shown) on the upper part of etched polysilicon structure 105) may be applied. As such steps are well known to those skilled in the art, they will not be described in more detail here. Although the gate electrode preferably comprises polysilicon, it may alternatively be formed from various metals with which metal oxide high-k gate dielectrics may be used. In addition, the gate electrode may comprise a combination of polysilicon and one or more metal or semi-metal materials.

As described above, reducing all or part of a metal oxide layer to form a metal layer, then reoxidizing that metal layer may yield a purified metal oxide high-k gate dielectric layer. Such a purified dielectric layer may include less than about twenty percent (20%) of the impurities that were included in the metal oxide layer. In addition, reoxidizing the metal layer using a mild oxidation process may generate a metal oxide high-k gate dielectric layer with a nearly idealized metal:oxygen stoichiometry, without causing a significant amount of oxide to form on the underlying substrate. As a consequence, the resulting metal oxide high-k gate dielectric layer may be used with a polysilicon-based gate electrode.

Although the embodiments described above are examples of processes for transforming a metal oxide layer into a metal oxide high-k gate dielectric layer that includes substantially less impurities and an improved metal:oxygen stoichiometry, the present invention is not limited to these particular embodiments. The present invention contemplates other processes that transform a metal oxide layer into a metal oxide high-k gate dielectric layer that is compatible with a gate electrode to be formed on it.

In the method of the present invention, a single reduction/reoxidation sequence may be applied after forming metal oxide layer 101. Alternatively, an iterative approach may be applied, e.g., when a relatively thick film is desired. In such an iterative process, a series of metal oxide deposition steps alternate with the above described reduction/reoxidation steps. After the initial metal oxide high-k gate dielectric layer is generated, a second metal oxide layer is formed on its surface. A second metal oxide high-k gate dielectric layer is then formed by reducing the second metal oxide layer to a second metal layer, then oxidizing that second metal layer. A third metal oxide layer may then be formed followed by a third reduction/reoxidation sequence, and so on, until the desired thickness for the metal oxide high-k gate dielectric layer is achieved.

Although the foregoing description has specified certain steps and materials that may be used in the method of the present invention, those skilled in the art will appreciate that many modifications and substitutions may be made. For example, although the gate electrode preferably is formed directly on the metal oxide high-k gate dielectric layer, intermediary layers may be formed between the dielectric layer and the gate electrode. Accordingly, it is intended that all such modifications, alterations, substitutions and additions be considered to fall within the spirit and scope of the invention as defined by the appended claims.

What is claimed is:

1. A method for making a semiconductor device comprising:
    forming a metal oxide layer on a substrate;
    converting at least part of the metal oxide layer to a metal layer; and
    oxidizing the metal layer to generate a metal oxide high-k gate dielectric layer;
    wherein the metal oxide layer is formed by atomic layer chemical vapor deposition, is between about 5 angstroms and about 40 angstroms thick, and comprises a material selected from the group consisting of hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide.

2. The method of claim 1 further comprising forming a gate electrode on the metal oxide high-k gate dielectric layer and wherein the metal oxide high-k gate dielectric layer comprises a material selected from the group consisting of hafnium oxide, zirconium oxide, titanium oxide, and aluminum oxide.

3. The method of claim 2 wherein the gate electrode comprises polysilicon.

4. The method of claim 2 wherein the gate electrode is a metal gate electrode.

5. The method of claim 1 wherein the metal layer is oxidized to generate a metal oxide high-k gate dielectric layer by exposing the metal layer to a solution that comprises a compound selected from the group consisting of hydrogen peroxide, an organic peroxide, and ozone.

6. A method for making a semiconductor device comprising:
    forming a metal oxide layer on a substrate, the metal oxide layer comprising halide impurities and a material selected from the group consisting of hafnium oxide, zirconium oxide, titanium oxide, and aluminum oxide;
    reducing at least part of the metal oxide layer to a metal layer by exposing the metal oxide layer to hydrogen;
    oxidizing the metal layer to generate a metal oxide high-k gate dielectric layer; and
    forming a polysilicon based gate electrode on the metal oxide high-k gate dielectric layer.

7. The method of claim 6 wherein at least part of the metal oxide layer is reduced to a metal layer by exposing the metal oxide layer to a hydrogen containing gas.

8. The method of claim 6 wherein the metal layer is oxidized to generate a metal oxide high-k gate dielectric layer by exposing the metal layer to a solution that contains a peroxide.

9. The method of claim 6 wherein the metal layer is oxidized to generate a metal oxide high-k gate dielectric layer by exposing the metal layer to a gas that contains oxygen.

10. The method of claim 6 wherein the amount of halide impurities included in the metal oxide high-k gate dielectric layer is less than about twenty percent of the amount of halide impurities included in the metal oxide layer, and the amount of oxygen included in the metal oxide high-k gate dielectric layer exceeds the amount of oxygen included in the metal oxide layer.

11. The method of claim 6 wherein no oxidation occurs on the substrate, when the metal layer is oxidized to generate a metal oxide high-k gate dielectric layer.

12. A method for making a semiconductor device comprising:

forming a metal oxide layer on a substrate, the metal oxide layer comprising halide impurities and a material selected from the group consisting of hafnium oxide, zirconium oxide, titanium oxide, and aluminum oxide;

reducing substantially all of the metal oxide layer to a metal layer by exposing the metal oxide layer to a hydrogen containing gas;

oxidizing the metal layer to generate a metal oxide high-k gate dielectric layer by exposing the metal layer to a solution that comprises a compound selected from the group consisting of hydrogen peroxide, an organic peroxide, and ozone or by exposing the metal layer to a gas that contains oxygen; and forming a polysilicon based gate electrode on the metal oxide high-k gate dielectric layer;

wherein the amount of halide impurities included in the metal oxide high-k gate dielectric layer is substantially less than the amount of halide impurities included in the metal oxide layer, and the amount of oxygen included in the metal oxide high-k gate dielectric layer significantly exceeds the amount of oxygen included in the metal oxide layer.

13. The method of claim 12 wherein an insignificant amount of oxidation occurs on the substrate, when the metal layer is oxidized to generate a metal oxide high-k gate dielectric layer.

14. The method of claim 13 wherein less then about 10 angstroms of oxide grows on the substrate, when the metal layer is oxidized to generate a metal oxide high-k gate dielectric layer.

* * * * *